(12) United States Patent
Lukas et al.

(10) Patent No.: US 7,404,990 B2
(45) Date of Patent: **\*Jul. 29, 2008**

(54) NON-THERMAL PROCESS FOR FORMING POROUS LOW DIELECTRIC CONSTANT FILMS

(75) Inventors: Aaron Scott Lukas, Lansdale, PA (US); Mark Leonard O'Neill, Allentown, PA (US); Mark Daniel Bitner, Nazareth, PA (US); Jean Louise Vincent, Bethlehem, PA (US); Raymond Nicholas Vrtis, Allentown, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/295,568

(22) Filed: Nov. 14, 2002

(65) Prior Publication Data

US 2004/0096672 A1 May 20, 2004

(51) Int. Cl.
*B05D 3/06* (2006.01)
*C08F 2/34* (2006.01)
*C08F 2/52* (2006.01)
*C08J 7/18* (2006.01)
*C08J 7/16* (2006.01)
*C23C 16/00* (2006.01)
*C23C 16/50* (2006.01)
*C23C 16/56* (2006.01)

(52) U.S. Cl. .............. 427/553; 427/554; 427/555; 427/487; 427/489; 427/532; 427/535; 427/543; 427/551; 427/255.37; 427/255.393; 438/790; 438/789

(58) Field of Classification Search ............... 427/508, 427/509, 510, 515, 520, 532, 541, 542, 553, 427/552, 554, 555, 556, 558, 559, 561, 562, 427/563, 569, 578, 574, 577, 579, 240, 249.1, 427/249.7, 255.25, 255.26, 255.27, 255.29, 427/255.37, 255.393, 255.394, 430.1
See application file for complete search history.

(56) References Cited

U.S. PATENT DOCUMENTS 5,454,915 A 10/1995 Shor et al. ............... 204/129.3

(Continued)

FOREIGN PATENT DOCUMENTS

EP 1037275 9/2000

(Continued)

OTHER PUBLICATIONS

U.S. Appl. No. 60/267,921, filed Feb. 12, 2001, Ball et al.*

(Continued)

*Primary Examiner*—Marianne L Padgett
(74) *Attorney, Agent, or Firm*—Rosaleen P. Morris-Oskani; Joseph D. Rossi (57) ABSTRACT

Low dielectric materials and films comprising same have been identified for improved performance when used as interlevel dielectrics in integrated circuits as well as methods for making same. In certain embodiments of the invention, there is provided a low-temperature process to remove at least a portion of at least one pore-forming phase within a multiphasic film thereby forming a porous film. The pore-forming phase may be removed via exposure to at least one energy source, preferably an ultraviolet light source, in a non-oxidizing atmosphere.

33 Claims, 3 Drawing Sheets

2) thin film before (---) and after(___) UV curing for 10 minutes at 5 millitorr. Note the decrease in absorption near 2900 cm$^{-1}$ and 1400 cm$^{-1}$, regions arising from C-H and C=C stretching, respectively.

U.S. PATENT DOCUMENTS

| | | | | |
|---|---|---|---|---|
| 5,593,737 | A | * | 1/1997 | Meinzer et al. ............. 427/512 |
| 5,895,263 | A | * | 4/1999 | Carter et al. ............... 438/624 |
| 5,935,646 | A | * | 8/1999 | Raman et al. .............. 427/244 |
| 6,042,994 | A | | 3/2000 | Yang et al. ................. 430/296 |
| 6,054,206 | A | | 4/2000 | Mountsier ................ 428/312.8 |
| 6,231,989 | B1 | * | 5/2001 | Chung et al. ............... 428/447 |
| 6,238,751 | B1 | | 5/2001 | Mountsier ................... 427/574 |
| 6,284,050 | B1 | | 9/2001 | Shi et al. .................... 118/715 |
| 6,312,793 | B1 | | 11/2001 | Grill et al. .............. 428/312.6 |
| 6,426,235 | B1 | * | 7/2002 | Matsushita et al. ............ 438/22 |
| 6,458,720 | B1 | * | 10/2002 | Aoi ............................ 438/781 |
| 6,472,076 | B1 | * | 10/2002 | Hacker ....................... 428/447 |
| 6,475,930 | B1 | | 11/2002 | Junker et al. ............... 438/787 |
| 6,596,467 | B2 | * | 7/2003 | Gallagher et al. ........... 430/314 |
| 6,596,834 | B2 | * | 7/2003 | Zhong ......................... 528/31 |
| 6,639,015 | B1 | * | 10/2003 | Nakashima et al. ......... 525/106 |
| 6,958,480 | B1 | * | 10/2005 | Iyer et al. ................... 250/340 |
| 6,960,327 | B2 | * | 11/2005 | Navrotsky et al. .......... 423/130 |
| 7,098,149 | B2 | * | 8/2006 | Lukas et al. ................ 438/778 |
| 7,132,171 | B2 | * | 11/2006 | Ohdaira et al. ............. 428/447 |
| 7,166,531 | B1 | * | 1/2007 | van den Hoek et al. ..... 438/623 |
| 7,169,715 | B2 | * | 1/2007 | Ott et al. .................... 438/780 |
| 7,208,389 | B1 | * | 4/2007 | Tipton et al. ................ 438/409 |
| 7,241,704 | B1 | * | 7/2007 | Wu et al. .................... 438/781 |
| 2001/0018129 | A1 | | 8/2001 | Shiota et al. ................ 428/447 |
| 2001/0038919 | A1 | | 11/2001 | Berry, III et al. ............ 428/446 |
| 2002/0102413 | A1 | | 8/2002 | Han et al. ................... 428/446 |
| 2002/0106500 | A1 | * | 8/2002 | Albano et al. ............ 428/304.4 |
| 2002/0132496 | A1 | | 9/2002 | Ball et al. ................... 438/780 |
| 2003/0003288 | A1 | * | 1/2003 | Nakata et al. ............ 428/304.4 |
| 2003/0032300 | A1 | | 2/2003 | Waldfried et al. ........... 438/725 |
| 2003/0054115 | A1 | | 3/2003 | Albano et al. ............... 427/487 |
| 2003/0087042 | A1 | * | 5/2003 | Murakami et al. .......... 427/551 |
| 2003/0157248 | A1 | * | 8/2003 | Watkins et al. .............. 427/255 |
| 2004/0018319 | A1 | * | 1/2004 | Waldried et al. ............ 427/508 |
| 2004/0058090 | A1 | * | 3/2004 | Waldfried et al. ........... 427/558 |
| 2004/0109950 | A1 | * | 6/2004 | Adams et al. ............... 427/387 |
| 2005/0048795 | A1 | | 3/2005 | Ko et al. |
| 2005/0255710 | A1 | * | 11/2005 | You et al. ................... 438/780 |
| 2006/0005608 | A1 | * | 1/2006 | Kitzhoffer et al. ............ 073/38 |
| 2006/0024976 | A1 | * | 2/2006 | Waldfried et al. ........... 438/778 |
| 2006/0078676 | A1 | * | 4/2006 | Lukas et al. ............. 427/248.1 |
| 2006/0183055 | A1 | * | 8/2006 | O'Neil et al. ............... 430/316 |
| 2007/0173071 | A1 | * | 7/2007 | Afzali-Ardakani et al. .. 438/781 |
| 2007/0299239 | A1 | * | 12/2007 | Weigel et al. ............... 528/349 |

FOREIGN PATENT DOCUMENTS

| | | |
|---|---|---|
| EP | 1 108 763 | 6/2001 |
| EP | 1 197 998 | 4/2002 |
| EP | 1 482 550 | 12/2004 |
| TW | 540118 | 3/1990 |
| WO | WO 0002241 | 1/2000 |
| WO | WO 0207191 | 1/2002 |
| WO | WO 02/11204 | 2/2002 |
| WO | WO 02065534 | 8/2002 |
| WO | WO 2004/083495 | 9/2004 |
| WO | WO 2005/019303 | 3/2005 |

OTHER PUBLICATIONS

A. Hozumi, et al., Low-Temperature Elimination of Organic Components from Mesostructured Organic—Inorganic Composite Films Using Vacuum Ultraviolet Light, Chem., Mater., 2000, 12, 3842-3847, no month.

M. Ouyang, et al., Conversion of Some Siloxane Polymers to Silicon Oxide by UV/Ozone Photochemical Processes, Chem Mater., 2000, 12, 1591-1596, no month, but published on Web May 2000.

A. Hozumi, et al., Micropatterned Silica Films with Ordered Nanopores Fabricated through Photocalcination, National Institute of Advanced Industrial Science & Technology, vol. 1, No. 8, Aug. 2001.

T. Clark, Jr., et al., A New Application of UV—Ozone Treatment in the Preparation of Substrate-Supported,Mesoporous Thin Films, Chem Mater., 2000, 12, 3879-3884, no month, but published on Web Dec. 2000.

Q. Han, et al., "Ultra Low-k Porous Silicon Dioxide Films from a Plasma Process," IEEE (2001), pp. 171-173, no month.

C. Waldfried, et al., "Single Water RapidCuring™ of Porous Low-k Materials," IEEE (2002), pp. 226-228, no month.

Dixit, Girish, et al., "Film Properties and Integration Performance of a Nano-Porous Carbon Doped Oxide", Applied Materials, Inc, Santa Clara, California, USA, International Interconnect Technology Conference, Jun. 2004.

Hozumi, A., et al., "Photocalcination of Mesoporous Silica Films Using Vaccum Ultraviolet Light", *Advanced Materials*, Wiley VCH, Weinheim, DE, vol. 12, No. 13, Jul. 5, 2000, pp. 985-987.

Grill, A. et al., "Multiphase Low-K Materials Prepared by PECVD", Electrochemical Society Proceedings, vol. 2000-5, pp. 55-62.

\* cited by examiner

Non-oxidizing Atmosphere

FIG. 1c 2) thin film before (---) and after(___) UV curing for 10 minutes at 5 millitorr. Note the decrease in absorption near 2900 cm$^{-1}$ and 1400 cm$^{-1}$, regions arising from C-H and C=C stretching, respectively.

NON-THERMAL PROCESS FOR FORMING POROUS LOW DIELECTRIC CONSTANT FILMS

BACKGROUND OF THE INVENTION

The present invention relates generally to the formation of porous films. More specifically, the invention relates to porous materials and films comprising same having a low dielectric constant and methods for making same.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitive crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials are desirable for use, for example, as premetal dielectric layers or interlevel dielectric layers.

Undoped silica glass ($SiO_2$), subsequently referred to herein as "USG", has been long used in integrated circuits as a primary insulting material because of its relatively lower dielectric constant of approximately 4.0 compared to other inorganic materials. The industry has attempted to produce silica-based materials with lower dielectric constants by incorporating organics or other materials within the silicate lattice. For example, dielectric constants ranging from 2.7 to 3.5 can be achieved by incorporating terminal groups such as fluorine or methyl into the silicate lattice. These materials are typically deposited as dense films (density~1.5 g/cm$^3$) and integrated within the IC device using process steps similar to those for forming USG films.

Since the dielectric constant of air is nominally 1.0, yet another approach to reducing the dielectric constant of a material may be to introduce porosity or reducing the density of the material. A dielectric film when made porous may exhibit lower dielectric constants compared to a relatively denser film.

Porosity has been introduced in low dielectric materials through a variety of different means. For example, porosity may be introduced by decomposing part of the film resulting in a film having an increased porosity and a lower density. Additional fabrication steps may be required for producing porous films that ultimately add both time and energy to the fabrication process. Minimizing the time and energy required for fabrication of these films is desirable; thus discovering materials that can be processed easily, or alternative processes that minimize processing time, is highly advantageous.

A method used extensively in the literature for introducing porosity into a film is thermal annealing to decompose at least a portion of the film thereby creating pores and ultimately lowering the dielectric constant. In the annealing step, or curing step, the film is typically heated to decompose and/or remove volatile components and substantially cross-link the film. U.S. Pat. No. 6,312,793 describes a multiphasic material having a first phase consisting essentially of Si, C, O, and H and a second phase consisting essentially of C and H. The material is heated to a temperature of at least 300° C. and for a time of at least 15 minutes to induce removal of one of the phases. European Patent Application WO 00/02241 describes drying an alkoxysilane material at a temperature from 100 to 400° C. for a time of 1 to 10 minutes to induce formation of pores. European Patent Application WO 02/07191 A2 describes heating a silica zeolite thin film to a temperature range of from 350 to 550° C. for an unspecified amount of time to induce adsorbed material to leave the zeolitic framework thereby lowering the dielectric constant.

The majority of the aforementioned processes require curing steps at temperatures of 300° C. or higher and times of 30 minutes or longer. A primary concern in the production of a low dielectric film may be the overall thermal budget of the IC device. Consequently, various components of IC devices such as Cu metal lines can only be subjected to processing temperatures for short time periods before their performance deteriorates due to undesirable diffusion processes.

An alternative to the thermal anneal or curing step is the use of ultraviolet light in combination with an oxygen-containing atmosphere to create pores within the material and lower the dielectric constant. The references, Hozumi, A. et al. "Low Temperature Elimination of Organic Components from Mesostructured Organic-inorganic Composite Films Using Vacuum Ultraviolet Light", Chem. Mater. 2000 Vol. 12, pp. 3842–47 ("Hozumi I") and Hozumi, A et al., "Micropatterned Silica Films with Ordered Nanopores Fabricated through Photocalcination", NanoLetters 2001, 1(8), pp. 395–399 ("Hozumi II"), describe removing a cetyltrimethylammonium chloride (CTAC) pore-former from a tetraethoxysilane (TEOS) film using ultraviolet ("VUV") light (172 nm) in the presence of oxygen. The reference, Ouyang, M., "Conversion of Some Siloxane Polymers to Silicon Oxide by UV/Ozone Photochemical Processes", Chem. Mater. 2000, 12(6), pp. 1591–96, describes using UV light ranging from 185 to 254 nm to generate ozone in situ to oxidize carbon side groups within poly(siloxane) films and form a $SiO_2$ film. The reference, Clark, T., et al., "A New Preparation of UV-Ozone Treatment in the Preparation of Substrate-Supported Mesoporous Thin Films", Chem. Mater. 2000, 12(12), pp. 3879–3884, describes using UV light having a wavelength between 187 and 254 nm to produce ozone and atomic oxygen to remove organic species within a TEOS film. These techniques, unfortunately, may damage the resultant film by chemically modifying the bonds that remain within the material.

Accordingly, there is a need in the art to provide an improved method to produce low density and porous materials. There is also a need to provide a process for preparing a low dielectric film that does not chemically modify the film nor inhibit the pore formation process. There is a further need to provide a method that is selective in removing certain material from a film while leaving the remaining material unaffected. Due to thermal budget concerns, there is an additional need for a low temperature treatment for the production of porous films for low dielectric constant materials for integrated circuits.

All references cited herein are incorporated herein by reference in their entirety.

BRIEF SUMMARY OF THE INVENTION

The present invention satisfies one, if not all, of the needs of the art by providing a process for forming a porous film. Specifically, in one aspect of the present invention, there is provided a process comprising: forming a multiphasic film onto at least a portion of a substrate wherein the multiphasic film comprises at least one structure-forming phase and at least one pore-forming phase wherein the at least one pore-forming phase is dispersed within the at least one structure-forming phase and exposing the multiphasic film to one or more energy sources within a non-oxidizing atmosphere for a time sufficient to remove at least a portion of the at least one pore-forming phase contained therein and provide the porous film.

In another aspect of the present invention, there is provided a process for preparing a porous film comprising: forming a multiphasic film onto at least a portion of a substrate wherein the multiphasic film comprises at least one structure-forming phase and at least one pore-forming phase wherein the at least one pore-forming phase is dispersed within the structure-forming phase; exposing the multiphasic film to one or more energy sources within a non-oxidizing atmosphere for a time sufficient to remove at least a portion of the at least one pore-forming phase contained therein and provide the porous film; and treating the porous film with one or more second energy sources.

In a still further aspect of the present invention, there is provided a process for preparing a porous film comprising: forming a multiphasic film onto at least a portion of a substrate wherein the multiphasic film comprises at least one structure-forming phase and at least one pore-forming phase wherein the at least one pore-forming phase is dispersed within the at least one structure-forming phase and exposing the multiphasic film to an ultraviolet light source within a non-oxidizing atmosphere for a time sufficient to remove at least a portion of the at least one pore-forming phase contained therein and provide the porous film.

In yet a further aspect of the present invention, there is provided a process for preparing a porous film comprising: forming a multiphasic film having a first density onto at least a portion of a substrate wherein the multiphasic film comprises at least one structure-forming phase and at least one pore-forming phase wherein the at least one pore-forming phase is dispersed within the at least one structure-forming phase and exposing the multiphasic film to an ultraviolet light source within a non-oxidizing atmosphere for a time sufficient to substantially remove the at least one pore-forming phase contained therein and provide the porous film wherein the density of the porous film is at least 10 percent less than the density of the multiphasic film.

In another aspect of the present invention, there is provided a chemical vapor deposition method for producing a porous film represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic %, and z is from 0 to 15 atomic % comprising: providing a substrate within a vacuum chamber; introducing into the vacuum chamber gaseous reagents including at least one structure-former gas selected from the group consisting of an organosilane and an organosiloxane, and a pore-former distinct from the at least one precursor gas; applying energy to the gaseous reagents in the vacuum chamber to induce reaction of the gaseous reagents to deposit a multiphasic film on the substrate, wherein the multiphasic film comprises at least one structure-forming phase and at least one pore-forming phase, and the preliminary film is deposited without added oxidants; and exposing the multiphasic film to an ultraviolet light source within a non-oxidizing atmosphere for a time sufficient to substantially remove the at least one pore-forming phase contained therein and provide the porous film comprising a plurality of pores and a dielectric constant of 2.7 or less.

In yet a further aspect of the present invention, there is provided a porous film having a dielectric constant of 2.7 or below. The porous film is comprised of: at least one structure-forming phase consisting essentially of Si, C, H, O, and F; at least one pore-forming phase consisting essentially of C and H and dispersed within the structure-forming phase; and a plurality of pores having an average size of about 100 nm or less wherein the plurality of pores are formed by removing at least a portion of the pore-forming phase by exposure to an ultraviolet light source.

These and other aspects of the invention will become apparent from the following detailed description.

DETAILED DESCRIPTION OF THE INVENTION

The present invention is directed towards the preparation of porous and low density materials and films. In one embodiment of the present invention, there is provided a method for preparing a porous, low dielectric film that exhibits sufficient mechanical properties, thermal stability, and chemical resistance such as to oxygen or aqueous oxidizing environments thereby making it suitable for use as an interlayer dielectric in integrated circuits. The present invention provides a process for preparing a porous film from a multiphasic film containing at least one structure-forming phase and at least one pore-forming phase. The multiphasic film is exposed to one or more energy sources to remove at least a portion, or more preferably substantially remove, the at least one pore-forming phases contained therein while the at least one structure forming phases remains substantially unaffected. Unlike other prior art processes, the pore formation step may be conducted at relatively lower temperatures and relatively shorter cycle times. Further, the pore formation step does not chemically modify the remaining structure-forming phase(s) that forms the resulting porous film.

The multiphasic material is preferably a film that is formed onto at least a portion of a substrate. Suitable substrates that may be used include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("SiO$_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, anti-reflective coatings, photoresists, organic polymers, porous organic and inorganic materials, metals such as copper and aluminum, or diffusion barrier layers, e.g., TiN, Ti(C)N TaN, Ta(C)N, Ta, W, WN or W(C)N. The porous films of the present invention are preferably capable of adhering to at least one of the foregoing materials sufficiently to pass a conventional pull test, such as an ASTM D3359-95a tape pull test.

As mentioned previously, the multiphasic film comprises at least two phases: at least one structure-forming phase and at least one pore-forming phase. The at least one pore-forming phase may be dispersed within the structure-forming phases. The term "dispersed" as used herein includes discrete areas of pore-forming phase, air-gap (i.e., relatively large areas of pore-forming phase contained within a structure-forming shell), or bi-continuous areas of pore-forming phase. While not intending to be bound by theory, it is believed that the multiphasic film, when exposed to one or more energy sources, adsorbs a certain amount of energy to enable its removal from the material while leaving the bonds within the structure-forming phase intact. Depending upon the energy source and the chemistry of the pore-forming phase, the chemical bonds within the pore-forming phase may be broken thereby facilitating its removal from the material. In this manner, the pore-forming phase may be substantially removed from the multiphasic film thereby leaving a porous film that consists essentially of the structure-forming phase. The resultant porous film will have a lower density. In some embodiments, depending upon whether the pore-forming phase is substantially removed, the resultant porous film may also have a lower dielectric constant than the multiphasic film.

Figure 1A:
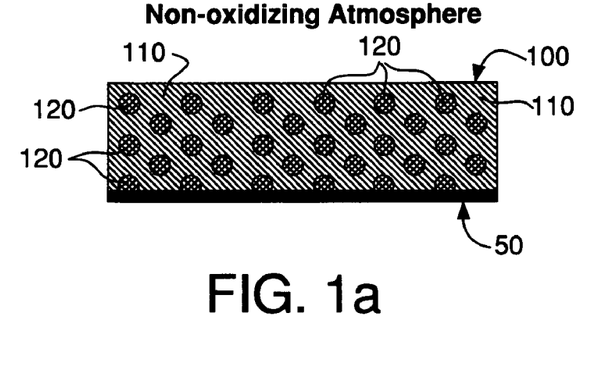
FIGS. 1a through 1c provides an illustration of the various steps of one embodiment of the present invention wherein the exposure to an UV radiation energy source results in the formation of pores within the film.
Figure 1B:
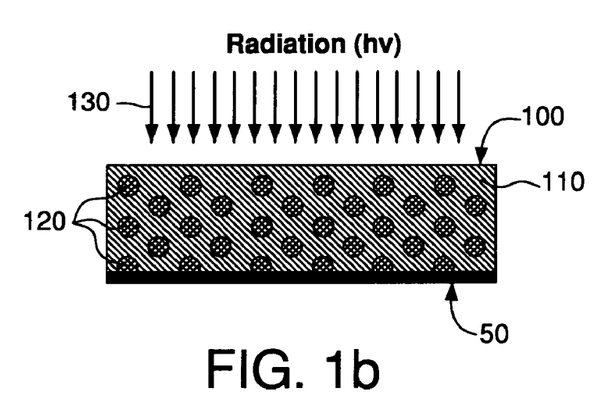
Figure 1C:
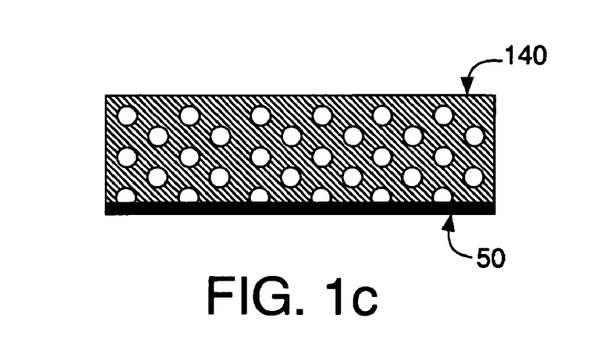

FIGS. 1a through 1c provide an illustration of one embodiment of the method of the present invention. Referring to FIG. 1a, multiphasic film 100 is formed upon at least a portion of a substrate 50. Multiphasic film 100 comprises at least two phases: at least one structure-forming phase 110 and at least one pore-forming phase 120 dispersed within the structure-forming phase 110. In certain preferred embodiments, the structure-forming phase 110 is an OSG compound containing primarily Si:O:C:H and the at least one pore-forming phase 120 is an organic compound containing primarily C:H. In FIG. 1b, multiphasic film 100 is exposed to one or more energy sources such as ultraviolet light 130. The exposure step depicted in FIG. 1b may be conducted at one or more temperatures below 425° C. and for a short time interval thereby consuming as little of the overall thermal budget of substrate 50 as possible. Referring now to FIG. 1c, the pore-forming phase 120 is substantially removed from the multiphasic film 100 leaving a porous film 140. The resultant porous film 140 will have a lower dielectric constant than the multiphasic film 100.

The at least one structure-forming phase of the multiphasic film comprises a compound or compounds that is capable of forming and maintaining an interconnecting network. Examples of these materials include, but are not limited to, undoped silicate glass ($SiO_2$), silicon carbide (SiC), hydrogenated silicon carbide (Si:C:H), silicon oxynitride (Si:O:N), silicon carbonitride (Si:C:N), fluorosilicate glass (Si:O:F), organofluorosilicate glass (Si:O:C:H:F), organosilicate glass (Si:O:C:H), diamond-like carbon, borosilicate glass (Si:O:B:H), or phosphorous doped borosilicate glass (Si:O:B:H:P). In certain preferred embodiment, the structure-forming phase comprises a silica compound. The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In certain preferred embodiments, the structure-forming phase may comprise an OSG compound represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %. Regardless of whether or not the structure-former is unchanged throughout the inventive process, the term "structure-former" as used herein is intended to encompass structure-forming reagents (or structure-forming substituents) and derivatives thereof, in whatever forms they are found throughout the entire process of the invention.

The at least one pore-forming phase of the multiphasic film comprises a compound or compounds that is capable of being easily and preferably substantially removed from the multiphasic film upon exposure to one or more energy sources. The pore-forming phase may also be referred to herein as a porogen. A "pore-former" is a reagent that is used to generate void volume within the resultant film. Regardless of whether or not the pore-former is unchanged throughout the inventive process, the term "pore-former" as used herein is intended to encompass pore-forming reagents (or pore-forming substituents) and derivatives thereof, in whatever forms they are found throughout the entire process of the invention. Suitable compounds to be used as the pore-forming phase of the present invention include, but are not limited to, hydrocarbon materials, labile organic groups, solvents, decomposable polymers, surfactants, dendrimers, hyper-branched polymers, polyoxyalkylene compounds, hydrocarbon compounds or combinations thereof. In certain preferred embodiments of the present invention, the pore-forming phase comprises a $C_1$ to $C_{13}$ hydrocarbon compound.

As mentioned previously, the materials of the present invention are formed into a multiphasic films onto at least a portion of a substrate from a precursor composition or mixture using a variety of different methods. These methods may be used by themselves or in combination. Some examples of processes that may be used to form the multiphasic film include the following: thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the multiphasic film of the present invention. Other processes that can be used to form the film include spin coating, dip coating, Langmuir-blodgett self assembly, or misting deposition methods.

In certain preferred embodiments, the multiphasic film is formed from a mixture of one or more gaseous reagents in a chemical vapor deposition process. Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor. In preferred embodiments of the present invention, the multiphasic film is formed through a PECVD process. Briefly, gaseous reagents are flowed into a reaction chamber such as a vacuum chamber and plasma energy energizes the gaseous reagents thereby forming a film on at least a portion of the substrate. In these embodiments, the multiphasic film can be formed by the codeposition, or alternatively the sequential deposition, of a gaseous mixture comprising at least one silica containing, preferably organosilicon material, that forms the structure-forming phase with at least one plasma-polymerizable organic material that forms the pore-forming phase. In certain embodiments, the plasma energy applied may range from 0.02 to 7 watts/cm$^2$, more preferably 0.3 to 3 watts/cm$^2$. Flow rates for each of the gaseous reagents may ranges from 10 to 5000 sccm. Pressure values in the vacuum chamber during deposition for a PECVD process of the present invention may range from 0.01 to 600 torr, more preferably 1 to 10 torr. It is understood however that process parameters such as plasma energy, flow rate, and pressure may vary depending upon numerous factors such as the surface area of the substrate, the structure-forming and pore-forming phases to be formed, the equipment used in the PECVD process, etc.

In a certain preferred embodiment of the present invention wherein the multiphasic film consists essentially of Si, C, O, H, and F, the multiphasic film is formed by providing a substrate within a vacuum chamber; introducing into the vacuum chamber gaseous reagents that comprises at least one structure-former gas selected from the group consisting of an organosilane and an organosiloxane, at least one precursor gas including a fluorine-providing gas that may forms at least a portion of the structure-former, and a pore-former distinct from the at least one precursor gas selected from the group consisting of an organosilane and an organosiloxane; and applying energy to the gaseous reagents in said chamber to induce reaction of the gaseous reagents and to form the film on the substrate. Examples of gaseous reagents used as structure-forming and pore-forming precursors may be found in U.S. Pat. Nos. 6,846,515 and 6,716,770, which are commonly assigned to the assignee of the present invention and incorporated herein by reference in their entirety.

Silica-containing gases such as organosilanes and organosiloxanes may be the preferred precursor gases to form the structure-forming phase of chemical vapor deposited multiphasic film. Suitable organosilanes and organosiloxanes include, e.g.: (a) alkylsilanes represented by the formula $R^1_n SiR^2_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, trimethylphenoxysilane and phenoxysilane); (b) a linear organosiloxane represented by the formula $R^1(R^2_2 SiO)_n SiR^2_3$ where n is an integer from 1 to 10, or cyclic organosiloxane represented by the formula $(R_1 R^2 SiO)_n$ where n is an integer from 2 to 10 and $R^1$ and $R^2$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^2(SiR^1, R^2)_n R^2$ where n is an integer from 2 to 10, or cyclic organosilane represented by the formula $(SiR^1 R^2)_n$, where n is an integer from 3 to 10, and $R^1$ and $R^2$ are as defined above (e.g., 1,2-dimethyldisilane, 1,1,2,2-tetramethyldisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisiiane). In certain embodiments, the organosilane/organosiloxane is a cyclic alkylsilane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate and di-tert-butoxydiacetoxysilane.

In certain embodiments, the at least one structure-forming phase further comprises fluorine. Preferred fluorine-providing gases for a CVD-deposited multiphasic film lack any F—C bonds (i.e., fluorine bonded to carbon) that could end up in the film. Thus, preferred fluorine-providing gases include, e.g., $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds. Additional preferred fluorine-providing gases include the above mentioned alkylsilanes, alkoxysilanes, linear and cyclic organosiloxanes, linear and cyclic organosilane oligomers, cyclic or bridged organosilanes, and organosilanes with reactive side groups, provided a fluorine atom is substituted for at least one of the silicon substituents, such that there is at least one Si—F bond. More specifically, suitable fluorine-providing gases include, e.g., fluorotrimethylsilane, difluorodimethylsilane methyltrifluorosilane, flurotriethoxysilane, 1,2-difluoro-1,1,2,2,-tetramethyldisilane, or difluorodimethoxysilane.

In embodiments where the multiphasic film is formed through a spin-on approach, the multiphasic film is formed from a mixture that comprises, inter alia, at least one structure-forming precursor, preferably a silica source, a pore-forming precursor or pore-former, a catalyst, and water. The mixture may further comprise a solvent and a surfactant. In brief, dispensing the mixture onto a substrate and evaporating the solvent and water can form the multiphasic film. The surfactant, remaining solvent and water, and pore-former are generally removed by exposing the coated substrate to one or more energy sources and for a time sufficient to produce the low dielectric film. In some instances, the multiphasic film may be pre-heated to substantially complete the hydrolysis of the silica source, continue the crosslinking process, and drive off any remaining solvent, if present, from the film.

In certain preferred embodiments, the mixture used to form the multiphasic film preferably comprises a silica source that may form the structure-forming phase. A "silica source", as used herein, is a compound having silicon (Si) and oxygen (O), and possibly additional substituents such as, but not limited to, other elements such as H, B, C, P, or halide atoms; alkyl groups; or aryl groups. The term "alkyl" as used herein includes straight chain, branched, or cyclic alkyl groups, preferably containing from 1 to 24 carbon atoms, or more preferably from 1 to 13 carbon atoms. This term applies also to alkyl moieties contained in other groups such as haloalkyl, alkaryl, or aralkyl. The term "alkyl" further applies to alkyl moieties that are substituted. The term "aryl" as used herein six to twelve member carbon rings having aromatic character. The term "aryl" also applies to aryl moieties that are substituted. The silica source may include materials that have a high number of Si—O bonds, but can further include Si—O—Si bridges, Si—R—Si bridges, Si—C bonds, Si—F bonds, Si—H bonds or a portion of the material can also have C—H bonds. It is preferred that at least one silica source have a minimum of Si—OH bonds. Other examples of the a silica source may include a fluorinated silane or fluorinated siloxane such as those provided in U.S. Pat. No. 6,258,407.

Another example of a silica source may include compounds that produce a Si—H bond upon removal of the pore-forming phase.

Still further examples of the source are found in the non-hydrolytic chemistry methods described, for example, in the references Hay et al., "Synthesis of Organic-Inorganic Hybrids via the Non-hydrolytic Sol-Gel Process", Chem. Mater., 13, 3396–3403 (2001) or Hay, et al., "A Versatile Route to Organically-Modified Silicas and Porous Silicas via the Non-Hydrolytic Sol-Gel Process", J. Mater. Chem., 10, 1811–1818 (2000).

Yet another example of the silica source may include colloidal silica, fumed silica, or silicic acid starting materials.

Still other examples of silica sources include silsesquioxanes such as hydrogen silsesquioxanes (HSQ, $HSiO_{1.5}$) and methyl silsesquioxanes (MSQ, $RSiO_{1.5}$ where R is a methyl group). Further examples of the suitable silica sources include those described in U.S. Pat. No. 6,271,273 and EP Nos. 1,088,868; 1,123,753, and 1,127,929. In preferred embodiments, the silica source may be a compound represented by the following: $R_aSi(OR^1)_{4-a}$, wherein R represents a hydrogen atom, a fluorine atom, or a monovalent organic group; $R^1$ represents a monovalent organic group; and a is an integer of 1 or 2; $Si(OR^2)_4$, where $R^2$ represents a monovalent organic group; or $R^3{}_b(R^4O)_{3-b}Si\text{-}(R^7)_d\text{-}Si(OR^5)_{3-c}R^6{}_c$, wherein $R^3$ to $R^6$ may be the same or different and each represents a monovalent organic group; b and c may be the same or different and each is a number of 0 to 2; $R^7$ represents an oxygen atom, a phenylene group, or a group represented by —$CH_2)_n$—, wherein n is an integer of 1 to 6; and d is 0 or 1; or combinations thereof. The term "monovalent organic group" as used herein relates to an organic group bonded to an element of interest, such as Si or 0, through a single C bond, i.e., Si—C or O—C.

In certain embodiments, the silica source may be added to the mixture as the product of hydrolysis and condensation. Hydrolysis and condensation of the silica source occurs by adding water and a catalyst to a solvent and adding the silica source at a time, intermittently or continuously, and conducting hydrolysis and condensation reactions while stirring the mixture at a temperature range generally from –30 to 100° C., preferably from 20 to 100° C., for 0 to 24 hours. The composition can be regulated to provide a desired solid content by conducting concentration or dilution with the solvent in each step of the preparation. Further, the silica source may be a compound that generates acetic acid when hydrolyzed.

The hydrolysis and condensation of the silica source can occur at any point during the formation of the multiphasic film, i.e., before adding to the mixture, after adding to the mixture, prior to, and/or during exposure to at least one energy source, etc. For example, in certain embodiments of the present invention, the one silica source is combined with the solvent, water, and surfactant in a vessel and the catalyst is gradually added into the vessel and mixed. It is envisioned that a variety of different orders of addition to the mixture can be used without departing from the spirit of the present invention.

The catalyst suitable for the present invention includes any organic or inorganic acid or base that can catalyze the hydrolysis of substitutents from the silica source in the presence of water, and/or the condensation of two silica sources to form a Si—O—Si bridge. The catalyst can be an organic base such as, but not limited to, quaternary ammonium salts and hydroxides, such as ammonium or tetramethylammonium, amines such as primary, secondary, and tertiary amines, and amine oxides. The catalyst can also be an acid such as, but not limited to, nitric acid, maleic, oxalic, acetic, formic, glycolic, glyoxalic acid, or mixtures thereof. In preferred embodiments, the catalyst comprises nitric acid.

Solvents that are suitable for the use in the present invention may include any solvents that exhibit solubility with the reagents. Solvents can be, for example, alcohol solvents, ketone solvents, amide solvents, or ester solvents. In certain embodiments the solvents may be a supercritical fluid such as carbon dioxide, fluorocarbons, sulfur hexafluoride, alkanes, and other suitable multi-component mixtures, etc. In certain embodiments, one or more solvents used in the present invention have relatively low boiling points, i.e., below 160° C. These solvents include, but are not limited to, tetrahydrofuran, acetone, 1,4-dioxane, 1,3-dioxolane, ethyl acetate, and methyl ethyl ketone. Other solvents, that can be used in the present invention but have boiling points above 160° C., include dimethylformamide, dimethylacetamide, N-methylpyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Preferred solvents include propylene glycol propyl ether (PGPE), 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, and propylene glycol methyl ether. Still further exemplary solvents include lactates, pyruvates, and diols. Further exemplary solvents include those solvents listed in EP 1,127,929. The solvents enumerated above may be used alone or in combination of two or more solvents.

The mixture used to form the multiphasic films of the present invention further comprises one or more pore-forming precursors that comprise the pore-forming phase. In subsequent process steps, the pore-forming phase is used to generate void volume within the resultant porous film upon its removal. The pore-former in the multiphasic film may or may not be in the same form as the pore-former within the mixture and/or introduced to the reaction chamber. As well, the pore-former removal process may liberate the pore-former or fragments thereof from the film. In essence, the pore-former reagent (or pore-former substituent attached to the precursor), the pore-former in the multiphasic film, and the pore-former being removed may or may not be the same species, although it is preferable that they all originate from the pore-former reagent (or pore-former substituent).

In certain embodiments of the present invention, the pore-former may be a hydrocarbon compound. Examples of these compounds include, but are not limited to, alpha-terpinene, limonene, cyclohexane, 1,2,4-trimethylcyclohexane, 1,5-dimethyl-1,5-cyclooctadiene, camphene, adamantane, 1,3-butadiene, substituted dienes and decahydronaphthelene.

In certain embodiments of the present invention, the pore-former may include labile organic groups. When some labile organic groups are present in the reaction mixture, the labile organic groups may contain sufficient oxygen to convert to gaseous products during the cure step. In yet other embodiments of the present invention, a film is deposited via CVD from a mixture comprising the labile organic groups with a peroxide compound followed by thermal annealing. Some examples of compounds containing labile organic groups include the compounds disclosed in U.S. Pat. No. 6,171,945, which is incorporated herein by reference in its entirety.

In some embodiments of the present invention, the pore-former may be a solvent. Solvents suitable for the present invention may be any of the solvents previously mentioned. In this connection, the solvent is generally present during at least a portion of the cross-linking of the matrix material. Solvents typically used to aid in pore formation have relatively higher boiling points, i.e., greater than 200° C.

In certain embodiments, the pore-former may be a small molecule such as those described in the reference Zheng, et al., "Synthesis of Mesoporous Silica Materials with Hydroxyacetic Acid Derivatives as Templates via a Sol-Gel Process", J. Inorg. Organomet. Polymers, 10, 103–113 (2000).

The pore-former could also be a decomposable polymer. The decomposable polymer may be radiation decomposable or thermally decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Thermally decomposable polymers undergo thermal decomposition at temperatures that approach the condensation temperature of the silica source materials and are present during at least a portion of the cross-linking. Such polymers are that which foster templating of the vitrification reaction, control and define pore size, and decompose and diffuse out of the matrix at the appropriate time in processing. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The pore-former of the present invention could also comprise a surfactant. For silica sol-gel based films in which the porosity is introduced by the addition of surfactant that is subsequently removed, varying the amount of surfactant can vary porosity. Typical surfactants exhibit an amphiphilic nature, meaning that they can be both hydrophilic and hydrophobic at the same time. Amphiphilic surfactants possess a hydrophilic head group or groups which have a strong affinity for water and a long hydrophobic tail which is organophilic and repels water. The surfactants can be anionic, cationic, nonionic, or amphoteric. Further classifications of surfactants include silicone surfactants, poly(alkylene oxide) surfactants, and fluorochemical surfactants. However, for the formation of dielectric layers for IC applications, non-ionic surfactants are generally preferred. The surfactants used in the present invention may not behave in the traditional sense, i.e., to form micelles or act as surface active agents. Suitable surfactants for use in the mixture include, but are not limited to, octyl and nonyl phenol ethoxylates such as TRITON® X-114, X-102, X-45, X-15; alcohol ethoxylates such as BRIJ® 56 ($C_{16}H_{33}$(OCH$_2$CH$_2$)$_{10}$OH) (ICI), BRIJ® 58 ($C_{16}H_{33}$(OCH$_2$CH$_2$)$_{20}$OH) (ICI), and acetylenics diols such as SURFYNOLS® 465 and 485 (Air Products and Chemicals, Inc.). Further surfactants include polymeric compounds such as the tri-block EO-PO-EO co-polymers PLURONIC® L121, L123, L31, L81, L101 and P123 (BASF, Inc.). Still further exemplary surfactants include alcohol (primary and secondary) ethoxylates, amine ethoxylates, glucosides, glucamides, polyethylene glycols, poly(ethylene glycol-co-propylene glycol), or other surfactants provided in the reference McCutcheon's *Emulsifiers and Detergents*, North American Edition for the Year 2000 published by Manufacturers Confectioners Publishing Co. of Glen Rock, N.J.

The pore-former may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", $2^{nd}$ Supplement, Aggarwal, pp. 71–132 (1996) which is incorporated herein by reference in its entirety.

The pore-former within the film-forming mixture may also be a polyoxyalkylene compound such as polyoxyalkylene non-ionic surfactants, polyoxyalkylene polymers, polyoxyalkylene copolymers, polyoxyalkylene oligomers, or combinations thereof. An example of such is a polyalkylene oxide that includes an alkyl moiety ranging from $C_2$ to $C_6$ such as polyethylene oxide, polypropylene oxide, and copolymers thereof.

In certain embodiments of the present invention, a single species of molecule may function as both the structure-former and pore-former within the multiphasic film. That is, the structure-forming precursor and the pore-forming precursor are not necessarily different molecules, and in certain embodiments, the pore-former is a part of (e.g., covalently bound to) the structure-forming precursor. Examples of these materials may be found, for example, in U.S. Pat. Nos. 6,846,515 and 6,716,770, which are commonly assigned to the assignee of the present invention and incorporated herein by reference in their entirety. Precursors containing pore-formers bound to them are sometimes referred to hereinafter as "porogenated precursors". For example, it is possible to use neohexyl TMCTS as a single species, whereby the TMCTS portion of the molecule forms the base OSG structure and the bulky alkyl substituent neohexyl is the pore-forming species which is removed during the anneal process. Having the pore-former attached to a Si species that will network into the OSG structure may be advantageous in achieving a higher efficiency of incorporation of pore-former into the film during the deposition process. Furthermore, it may also be advantageous to have two pore-formers attached to one Si in the precursor, such as in di-neohexyl-diethoxysilane, or two Si atoms attached to one pore-former, such as in 1,4-bis(di-ethoxysilyl)cylcohexane, since the most likely bond to break in a plasma during the deposition process is the Si-pore-former bond. In this manner, reaction of one Si-pore-former bond in the plasma will still result in incorporation of the pore-former in the deposited film.

In certain embodiments of the materials in which a single or multiple pore-former is attached to silicon, it may be advantageous to design the pore-former in such as way that when the film is cured to form the pores, a part of the pore-former remains attached to the silicon to impart hydrophobicity to the film. The pore-former in a precursor containing Si-pore-former may be chosen such that decomposition or curing leaves attached to the Si a terminal chemical group from the pore-former, such as a —CH$_3$. For example, if the pore-former neopentyl is chosen, it is expected that thermal annealing under the proper conditions would cause bond breakage at the C—C bonds beta to the Si, that is the bond between the secondary carbon adjacent to Si and the quaternary carbon of the t-butyl group will thermodynamically be the most favorable bond to break. Under proper conditions this would leave a terminal —CH$_3$ group to satisfy the Si, as well as provide hydrophobicity and a low dielectric constant to the film. Examples of precursors are neopentyl triethoxysilane, neopentyl diethoxy silane, and neopentyl diethoxymethylsilane.

In certain embodiments of the present invention, a chemical reagent such as a reducing agent may be added to the environment during the pore-former-phase removal process. The chemical reagent may be added to enhance the removal of the one or more pore-forming phases from the multiphasic film.

The multiphasic film is exposed to one or more energy sources to remove at least a portion, or more preferably substantially remove, the pore-forming phase and provide the porous film. In certain preferred embodiments, the amount of the pore-forming phase that remains within the porous film is about 5 percent by weight or less, preferably about 1 percent by weight or less, and more preferably about 0.5 weight percent or less. The energy source for the exposing step may include, but not be limited to, an ionizing radiation source such as α-particles, β-particles, y-rays, x-rays, high energy electron, and electron beam sources of energy; a nonionizing radiation source such as ultraviolet (10 to 400 nm), visible (400 to 750 nm), infrared (750 to $10^5$ nm), microwave (>$10^6$), and radio-frequency (>$10^6$) wavelengths of energy; or mixtures thereof. While not intending to be bound by theory, the multiphasic film may absorb the energy from the one or more energy sources which may be used to enable the removal of the pore forming phase or phases that contain bonds such as C—C, C—H, or C=C. The porous film may be substantially comprised of the remaining structure-forming phase(s) from the multiphasic film. The structure-forming phase(s) remains essentially the same, or is not chemically modified, by the exposure to the one or more energy sources. In other words, the composition of the resultant porous film may be generally the same as the composition of the structure-forming phase in the multiphasic film prior to exposure to one or more energy sources.

In certain preferred embodiments, the exposure step is conducted in a non-oxidizing atmosphere such as an inert atmosphere (e.g., nitrogen, helium, argon, etc.), a reducing atmosphere (e.g., $H_2$, CO), or vacuum. It is believed that the presence of oxygen during the exposure step may interfere with the removal of the pore-forming phase from the multiphasic film and substantially modify the structure forming phase(s) of the film.

In embodiments wherein the energy source comprises nonionizing radiation source, the multiphasic film may be exposed to one or more specific wavelength within the source or a broad spectrum of wavelengths. For example, the multiphasic film may be exposed to one or more particular wavelengths of light such as through a laser and/or optically focused light source. In the latter embodiments, the radiation source may be passed through optics such as lenses (e.g., convex, concave, cylindrical, elliptical, square or parabolic lenses), filters (e.g., RF filter), or windows (e.g., glass, plastic, fused silica, silicate, calcium fluoride, or magnesium fluoride windows) to provide specific and focused wavelengths of light. Alternatively, the radiation source does not pass through any optics.

Specific temperature and time durations for the exposure step may vary depending upon the chemical species used to comprise the multiphasic materials within the mixture. In certain preferred embodiments, the exposure step is conducted at a temperature below about 425° C., preferably below about 300° C., and more preferably below about 250° C. The exposure step is conducted for a time of about 60 minutes or less, preferably about 1 minute or less, and more preferably about 1 second or less.

The exposure step may be conducted in a variety of settings depending upon the process used to form the multiphasic film. It may be advantageous for the exposure step to be conducted after or even during at least a portion of the multiphasic film formation step. The exposure step can be performed in various settings such as, but not limited to, a quartz vessel, a modified deposition chamber, a conveyor belt process system, a hot plate, a vacuum chamber, a cluster tool, a single wafer instrument, a batch processing instrument, or a rotating turnstile.

In certain preferred embodiments, the one or more energy sources comprise an ultraviolet light source. An ultraviolet light source is preferable as an energy source because the ultraviolet light source provides an insignificant heating effect, i.e., does not significantly alter the temperature of the substrate. The temperature that the substrate is subjected to during exposure to an ultraviolet light source typically ranges from between 200 to 250° C. The multiphasic film may be exposed to one or more wavelengths within the ultraviolet spectrum or one or more wavelengths within the ultraviolet spectrum such as deep ultraviolet light (i.e., wavelengths of 280 nm or below) or vacuum ultraviolet light (i.e., wavelengths of 200 nm or below). The ultraviolet light may be dispersive, focused, continuous wave, pulsed, or shuttered. Sources for the ultraviolet light include, but are not limited to, an excimer laser, a barrier discharge lamp, a mercury lamp, a microwave-generated UV lamp, a laser such as a frequency doubled or frequency tripled laser in the IR or visible region, or a two-photon absorption from a laser in the visible region. The ultraviolet light source may be placed at a distance that ranges from 50 milli-inches to 1,000 feet from the multiphasic film.

The porous film of the present invention may be further subjected to post exposure, or treatment steps, such as treating the porous film with one or more second energy sources. This treatment step may be performed before, during, or after the exposing step. Preferably, the treatment step may be performed after or during at least a portion of the exposing step. The treatment step may increase the mechanical integrity of the material by, for example, promoting cross-linking within the porous film, stabilize the porous film, and/or remove additional chemical species from the network rather than forming pores. The one or more second energy sources can include any of the energy sources disclosed herein as well as thermal sources such as a hot plate, oven, furnace, or the like.

The conditions under which the treatment step is conducted can vary greatly. For example, the treatment step can be conducted under high pressure or under a vacuum ambient. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal energy sources as well as any other post-treating means. The temperature is preferably 200–500° C., and the temperature ramp rate is from 0.1 to 100 deg ° C./min. The total treatment time is preferably from 0.01 min to 12 hours.

In certain embodiments of the present invention, the porous film may be also subject to a chemical treatment to enhance the properties of the final material. Chemical treatment of the porous film may include, for example, the use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments. Chemicals used in such treatments can be in solid, liquid, gaseous and/or supercritical fluid states. In certain embodiments, supercritical fluid treatment may be used to treat the film. The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

In embodiments wherein the film is subjected to a plasma, the plasma is conducted under the following conditions: the environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0–5000 W. The temperature preferably ranges from ambient to 500° C. The pressure preferably ranges from 10 mtorr to atmospheric pressure. The total treatment time is preferably 0.01 min to 12 hours.

Photocuring for selective removal of the pore-forming phase and/or perfecting the lattice structure of the film is conducted under the following conditions: the environment can be inert (e.g., nitrogen, $CO_2$, noble gases (He, Ar, Ne, Kr, Xe), etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths <200 nm). The total curing time is preferably 0.01 min to 12 hours.

Microwave post-treatment for selective removal of the pore-forming phase and/or perfecting the lattice structure of the film is conducted under the following conditions: the environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of pore-formers or specific chemical species from an organosilicate film and/or improvement of film properties is conducted under the following conditions: the environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323–4330; G. Kloster et al., Proceedings of IITC, Jun. 3–5, 2002, SF, CA; and U.S. Pat. Nos. 6,207,555 B1, 6,204,201 B1 and 6,132,814 A1.

The films of the invention are porous. Total porosity of the film may be from 5 to 75% depending upon the process conditions and the desired final film properties. The average sizes within the porous film ranges from about 1 Å to about 500 Å, preferably from about 1 Å to about 100 Å, and most preferably from about 1 Å to about 50 Å. It is preferred that the film have pores of a narrow size range and that the pores are homogeneously distributed throughout the film. However, the porosity of the film need not be homogeneous throughout the film. In certain embodiments, there is a porosity gradient and/or layers of varying porosities. Such films can be provided by, e.g., adjusting the ratio of pore-forming phase to structure-forming phase during formation of the multiphasic film. The porosity of the films may have continuous or discontinuous pores.

The porous films of the invention preferably have a density of less than 2.0 g/ml, or alternatively, less than 1.5 g/ml or less than 1.25 g/ml. Preferably, the porous films of the invention have a density at least 10% less, preferably at least 25% less, and more preferably at least 50% less than the density of the unexposed multiphasic film.

The porous films of the invention have a lower dielectric constant relative to common OSG materials. Preferably, porous films of the invention have a dielectric constant of about 2.7 or below, preferably about 2.4 or below, and more preferably about 2.2 or below.

In certain embodiments the films of the invention are thermally stable, with good chemical resistance. In particular, the films after the exposure step have an average weight loss of less than 1.0 wt %/hr isothermal at 425° C. under $N_2$.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, or WN.

Although the invention is particularly suitable for providing films and products of the invention are largely described herein as films, the invention is not limited thereto. Products of the invention can be provided in any form such as coatings, multilaminar assemblies, and other types of objects that are not necessarily planar or thin, and a multitude of objects not necessarily used in integrated circuits. Preferably, the substrate is a semiconductor.

The invention will be illustrated in more detail with reference to the following examples, but it should be understood that the present invention is not deemed to be limited thereto.

EXAMPLES

The sample films were formed via a plasma enhanced CVD process using an Applied Materials Precision-5000 system in a 200 mm DxZ vacuum chamber that was fitted with an Advance Energy 200 rf generator and using an undoped TEOS process kit. The CVD process involved the following basic steps: initial set-up and stabilization of gas flows deposition, and purge/evacuation of chamber prior to wafer removal.

The thickness and refractive index of each film were measured on an SCI Filmtek 2000 Reflectometer. Dielectric constants were determined using Hg probe technique on low resistivity p-type wafers (<0.02 ohm-cm). Mechanical properties were determined using MTS Nano Indenter.

In some of the following examples, UV exposure was performed using a Fusion UV model F305 ultraviolet lamp. The films subjected to UV exposure were placed in a 2" diameter quartz glass tube with sealed end caps. In examples involving a vacuum or inert atmospheres, three pump and purge cycles were performed prior to UV exposure to ensure that any oxygen present was removed from the process tube. Exposure times varied between 0 and 30 minutes.

Comparative Example A

DEMS Film Having ATP as Pore-Former Subjected to Thermal Curing

A multiphasic film formed via PECVD of diethoxy methylsilane (DEMS) as the structure-forming phase and alpha-terpinene (ATP) as the pore-forming phase and carbon dioxide carrier gas had the following properties before thermal curing: thickness of 1034 nm, dielectric constant of 2.8, and refractive index of 1.509. The film was heated in a tube furnace to 425° C. for 4 hours at ambient pressure under 2 sipm nitrogen purge. After thermal curing, the thickness was 825 nm and the refractive index was 1.355. The dielectric constant was 2.21. The film properties before and after thermal curing are described in Table 1.

Example 1

DEMS Film Having ATP as Pore-Former Subjected to UV Exposure

A multiphasic film formed via plasma enhanced chemical vapor codeposition (PECVD) of diethoxy methylsilane as the structure-forming phase and ATP as the pore-forming phase and carbon dioxide as carrier gas had the following properties before UV exposure: thickness of 1018 nm, dielectric constant of 2.8, and refractive index of 1.509. The film was exposed to UV light at a pressure of 5 millitorr for 10 minutes. The temperature of the film reached approximately 200° C. during the exposure. The thickness after UV exposure was 790 nm, and the refractive index was 1.363. The dielectric constant was 2.21.

Figure 2:
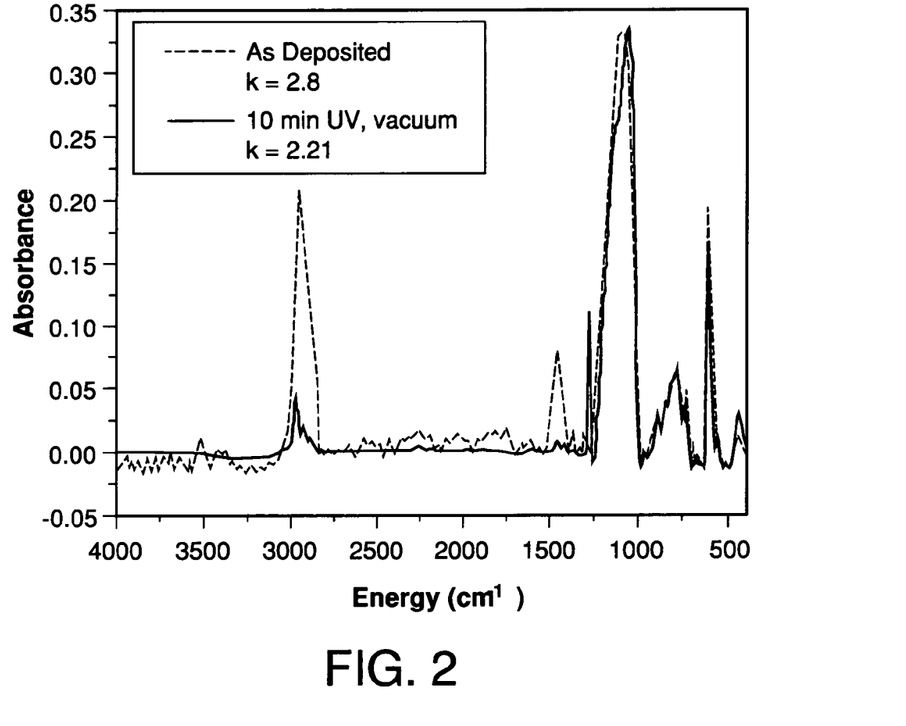
FIG. 2 provides an infrared spectrum of one embodiment of the film of the present invention wherein the pore-forming phase of the film is alpha-terpenine (ATP) and the exposure to UV radiation energy is conducted in a non-oxidizing environment.

FIG. 2 displays an infrared spectra of the film before (see dashed line) and after (see solid line) UV exposure, indicating reduced absorption in the C—H and C=C regions of the spectrum following UV exposure. The reduced absorption in these regions of the spectrum may indicate that the pore-forming phase, or ATP, is substantially removed as a result of the UV exposure. The film properties both before and after UV exposure are described in Table 1.

Example 1 illustrates that a 10 minute exposure to UV light under vacuum can effect the same changes in film properties as a 4 hour thermal curing step conducted under ambient nitrogen in Comp. Ex. A. The milder processing conditions and shorter time duration needed to achieve the same final film properties could substantially decrease the process time and energy necessary for semiconductor processing.

Example 2

DEMS Film Having ATP as Pore-Former Subjected to UV Exposure and Post-UV Exposure Thermal Treatment A multiphasic film formed via plasma enhanced chemical vapor codeposition (PECVD) of diethoxy methylsilane as the structure-forming phase and ATP as the pore-forming phase and carbon dioxide as carrier gas had the following properties before UV exposure: thickness of 1008 nm, a dielectric constant of 2.8, and a refractive index of 1.504. The film was exposed to UV light at a pressure of 5 millitorr for 10 minutes. The temperature of the film reached approximately 200° C. during the curing process. The thickness after curing was 847 nm, and the refractive index was 1.369. The dielectric constant was 2.25. The film was then heated in a tube furnace to 425° C. for 90 minutes at ambient pressure under nitrogen purge. The thickness after thermal curing was 800 nm, and the refractive index was 1.359. The dielectric constant was 2.24. The film properties before and after thermal treatment are described in Table 1.

Example 2 illustrates that the UV exposure step may stabilize the film for subsequent thermal or other treatments. There was substantially no change in the dielectric constant or refractive index of the film when a UV-exposed film was heated to 425° C. for 90 minutes under nitrogen. While there is some thickness loss from the film, this loss did not affect the overall film properties such as dielectric constant or refractive index.

Comparative Example B

DEMS Film Having ATP as Pore-Former Subjected to UV Exposure in an Air Atmosphere A multiphasic film formed via plasma enhanced chemical vapor codeposition (PECVD) of diethoxy methylsilane as the structure-forming phase and ATP as the pore-forming phase and carbon dioxide as carrier gas had the following properties before UV exposure: thickness of 720 nm, a dielectric constant of 2.8, and a refractive index of 1.510. The film was exposed to UV light at ambient pressure under air (approximately 21% oxygen) for 5 minutes. The temperature of the film reached approximately 100° C. during the UV exposure step. The thickness after UV exposure was 640 nm, and the refractive index was 1.525. The dielectric constant was 4.80.

Figure 3:
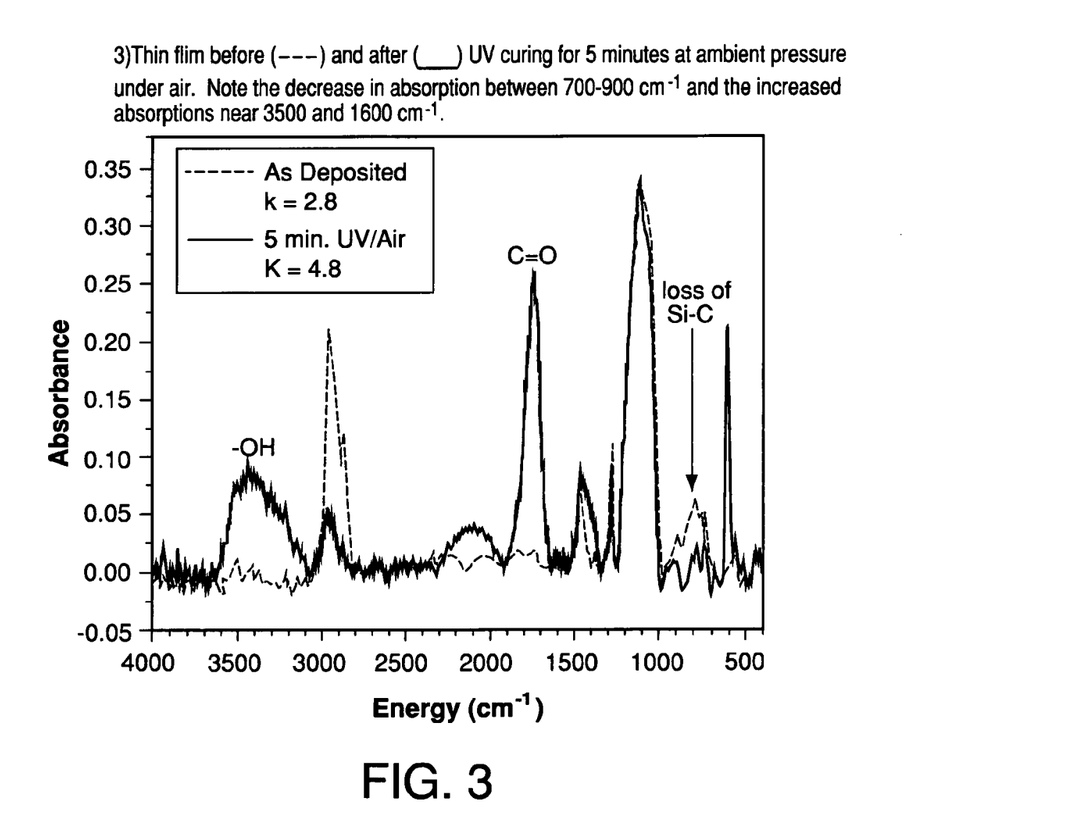
FIG. 3 provides an infrared spectrum of a comparative film wherein the pore-forming phase of the film is alpha-terpenine (ATP) and the exposure to UV radiation energy is conducted in an oxidizing environment.

FIG. 3 displays infrared spectra of the film before (dashed line) and after (solid line) UV exposure, indicating the elimination of Si—C bonds from the film and the formation of —OH and C=O groups within the film. The film properties before and after UV exposure are described in Table 1.

The prior art provides various examples of UV exposure under air or oxygen containing atmospheres. Comp. Ex. B establishes that UV exposure of low dielectric films under air or oxygen containing atmosphere may lead to deleterious effects such as water sorption and the formation of C=O and —OH groups within the films. These groups, unfortunately, may raise the dielectric constant of the film as evidenced by the increase in dielectric constant from 2.8 to 4.8. Comparing Comp. Ex. B. with Example 1, Example 1 avoids the possibility of C=O and —OH group formation by UV exposure in a non-oxidizing atmosphere and the dielectric constant of the film is lowered rather than increased.

Comparative Example C

DEMS Film Having 5-dimethyl-1,4-cyclooctadiene as Pore-former Subjected to Thermal Curing A multiphasic film formed via PECVD having diethoxy methylsilane as the structure-forming phase, 2,5-dimethyl-1,4-cyclooctadiene as the pore-forming phase, and carbon dioxide as the carrier gas had the following properties before thermal curing: thickness of 1027 nm, dielectric constant of 2.8, and refractive index of 1.484. The film was heated in a tube furnace to 425° C. for 4 hours at ambient pressure under 2 slpm nitrogen purge. After thermal curing the thickness was 894 nm, and the refractive index was 1.364. The dielectric constant was 2.43. The film properties before and after thermal curing are described in Table 1.

Example 3

DEMS Film Having 5-dimethyl-1,4-cyclooctadiene as Pore-former Subjected to UV Exposure A multiphasic film formed via PECVD having diethoxy methylsilane as the structure-forming phase, 2,5-dimethyl-1,4-cyclooctadiene as the pore-forming phase, and carbon dioxide as the carrier gas had the following properties before UV exposure: thickness of 934 nm, dielectric constant of 2.8, and refractive index of 1.484. The film was exposed to UV light at a pressure of 5 millitorr for 20 minutes. The temperature of the film reached approximately 200° C. during the exposure. The thickness after UV exposure was 809 nm, and the refractive index was 1.352. The dielectric constant was 2.52. The film properties both before and after UV exposure are described in Table 1.

Example 3 establishes that the UV exposure step like a thermal curing step (see Comp. Ex. C) may reduce the dielectric constant and refractive index of the multiphasic film by removing at least a portion of the pore-forming phase within the multiphasic film. However, the milder process conditions and shorter time needed to achieve the similar final film properties could substantially decrease the process time and energy necessary for semiconductor processing.

Comparative Example D

DEMS Film Having Decahydronaphthalene Pore-Former Subjected to Thermal Curing A muliphasic film formed via PECVD of diethoxy methylsilane as the structure-forming phase, decahydronaphthalene as the pore-forming phase, and carbon dioxide carrier gas had the following properties before thermal curing: thickness of 493 nm, dielectric constant of 2.65, and refractive index of 1.490. The film was heated in a tube furnace to 425° C. for 4 hours at ambient pressure under 2 slpm nitrogen purge. After thermal curing the thickness after thermal curing was 438 nm, and the refractive index was 1.334. The dielectric constant was 2.20. The film properties both before and after thermal curing are described in Table 1.

Example 4

DEMS Film Having Decahydronaphthalene Pore-Former Subjected to UV Exposure

A muliphasic film formed via PECVD of diethoxy methylsilane as the structure-forming phase, decahydronaphthalene as the pore-forming phase, and carbon dioxide carrier gas had the following properties before UV exposure: thickness of 474 nm, dielectric constant of 2.65, and refractive index of 1.490. The film was exposed to UV light at a pressure of 5 millitorr for 20 minutes. The temperature of the film reached approximately 200° C. during the exposure. The thickness after UV exposure was 375 nm, and the refractive index was 1.333. The dielectric constant was 2.33. The film properties both before and after UV exposure are described in Table 1.

Example 4 establishes that a UV exposure step for 20 minutes under vacuum can effect the similar changes in film properties as a 240 minute thermal curing step under ambient nitrogen for the same compound used as the pore-forming phase (see Comp. Ex. D). However, the milder conditions and shorter time needed to achieve the similar final film properties could substantially decrease the process time and energy necessary for semiconductor processing.

Comparative Example E

DEMS Film Having Ethylbenzene as Pore-Former Subjected to Thermal Curing

A multiphasic film formed via PECVD of diethoxy methylsilane as the structure-forming phase, ethylbenzene as the pore-forming phase, and carbon dioxide carrier gas had the following properties before thermal curing: thickness of 612 nm, dielectric constant of 2.75, and refractive index of 1.495. The film was heated in a tube furnace to 425° C. for 4 hours at ambient pressure under 2 slpm nitrogen purge. After thermal curing the thickness after thermal curing was 511 nm, and the refractive index was 1.352. The dielectric constant was 2.38. The film properties both before and after thermal curing are described in Table 1.

Example 5

DEMS Film Having Ethylbenzene as Pore-Former Subjected to UV Exposure

A multiphasic film formed via PECVD of diethoxy methylsilane as the structure-forming phase, ethylbenzene as the pore-forming phase, and carbon dioxide carrier gas had the following properties before UV exposure: thickness of 586 nm, dielectric constant of 2.75, and refractive index of 1.495. The film was exposed to UV light at a pressure of 5 millitorr for 20 minutes. The temperature of the film reached approximately 200° C. during the exposure. The thickness after UV exposure was 529 nm, and the refractive index was 1.398. The dielectric constant was 2.31. The film properties both before and after UV exposure are described in Table 1.

Example 5 establishes that the UV exposure step like a thermal curing step (see Comp. Ex. E) may reduce the dielectric constant and refractive index of the multiphasic film by removing at least a portion of the pore-forming phase within the multiphasic film. However, the milder process conditions and shorter time needed to achieve the similar final film properties could substantially decrease the process time and energy necessary for semiconductor processing.

Comparative Example F

DEMS Film Having Limonene as Pore-former Subjected to Thermal Curing

A multiphasic film formed via PECVD having diethoxy methylsilane as the structure-forming phase, limonene as the pore-forming phase, and carbon dioxide as the carrier gas had the following properties before thermal curing: thickness of 554 nm, dielectric constant of 2.58, and refractive index of 1.529. The film was heated in a tube furnace to 425° C. for 4 hours at ambient pressure under 2 slpm nitrogen purge. After thermal curing the thickness after UV exposure was 297 nm, and the refractive index was 1.453. The dielectric constant was 2.56. The film properties both before and after thermal curing are described in Table 1.

Example 6

DEMS Film Having Limonene as Pore-former Subjected to UV Exposure

A multiphasic film formed via PECVD having diethoxy methylsilane as the structure-forming phase, limonene as the pore-forming phase, and carbon dioxide as the carrier gas had the following properties before UV exposure: thickness of 570 nm, dielectric constant of 2.58, and refractive index of 1.529. The film was exposed to UV light at a pressure of 5 millitorr for 20 minutes. The temperature of the film reached approximately 200° C. during the exposure. The thickness after UV exposure was 355 nm, and the refractive index was 1.472. The dielectric constant was 2.27. The film properties both before and after UV exposure are described in Table 1.

Example 6 shows that a UV exposure step for 20 minutes under vacuum can be effective to lower the dielectric constant of films where thermal curing for 240 minutes at 425° C. under nitrogen is not effective (see Comp. Ex. 6). The milder conditions and shorter time duration needed to achieve a lower dielectric constant than that obtainable by thermal curing is a significant improvement from both a performance and process viewpoint. It also demonstrates significantly that it may be possible to tailor specific pore-former species to be more reactive towards UV exposure than a thermal curing step for their removal from a multiphasic film.

TABLE 1

Film Property Data

| Example | K | Refractive Index | Thickness | Δ Thickness (%) | H (GPa) | M (GPa) |
|---|---|---|---|---|---|---|
| Comp Ex. A (pre) | 2.80 | 1.509 | 1034 nm | — | 0.4 | 3.5 |
| Comp. Ex. A (post) | 2.21 | 1.355 | 825 nm | 20 | 0.25 | 2.6 |
| Ex. 1 (pre) | 2.80 | 1.509 | 1018 nm | — | 0.4 | 3.5 |
| Ex. 1 (post) | 2.21 | 1.363 | 790 nm | 22 | 0.18 | 2.1 |
| Ex. 2 (pre) | 2.80 | 1.504 | 1008 nm | — | — | — |
| Ex. 2 (post-UV) | 2.25 | 1.369 | 847 nm | 16 | — | — |
| Ex. 2 (post-UV-thermal) | 2.24 | 1.359 | 800 nm | 5.5 | — | — |
| Comp. Ex. B (pre) | 2.80 | 1.510 | 720 nm | — | — | — |
| Comp. Ex. B (post) | 4.80 | 1.525 | 640 nm | 15 | — | — |
| Comp. Ex. C (pre) | 2.80 | 1.484 | 1027 nm | — | — | — |
| Comp. Ex. C (post) | 2.43 | 1.364 | 894 nm | 13 | — | — |
| Ex. 3 (pre) | 2.80 | 1.484 | 934 nm | — | — | — |
| Ex. 3 (post) | 2.52 | 1.352 | 809 nm | 13 | — | — |
| Comp. Ex. D (pre) | 2.65 | 1.490 | 493 nm | — | — | — |
| Comp. Ex. D (post) | 2.20 | 1.334 | 438 nm | 11 | — | — |
| Ex. 4 (pre) | 2.65 | 1.490 | 474 nm | — | — | — |
| Ex. 4 (post) | 2.33 | 1.333 | 375 nm | 21 | — | — |
| Comp. Ex. E (pre) | 2.75 | 1.495 | 612 nm | — | — | — |
| Comp. Ex. E (post) | 2.38 | 1.352 | 511 nm | 17 | — | — |
| Ex. 5 (pre) | 2.75 | 1.495 | 586 nm | — | — | — |
| Ex. 5 (post) | 2.31 | 1.398 | 529 nm | 10 | — | — |
| Comp. Ex. F (pre) | 2.58 | 1.529 | 554 nm | — | — | — |
| Comp. Ex. F (post) | 2.56 | 1.453 | 297 nm | 46 | — | — |
| Ex. 6 (pre) | 2.58 | 1.529 | 570 nm | — | — | — |
| Ex. 6 (post) | 2.27 | 1.472 | 355 nm | 38 | — | — |

In summary, comparison of the IR spectrum of as-deposited multiphasic films and the porous films after UV exposure shows that UV exposure under vacuum is successful for selective removal of C=C and C—H groups from the films. There is essentially no change in the Si—$CH_3$ absorption at 1275 $cm^{-1}$. However, there is seen a dramatic reduction in C—H absorptions near 3000 $cm^{-1}$ suggesting that essentially all the carbon-carbon bonds are removed from the films.

The hydrophobicity of the films after UV exposure under vacuum is substantiated by the lack of Si—OH groups in the IR spectrum. The decrease in refractive index and dielectric constants of the films after UV exposure suggests that the porous films are less dense than the multiphasic films, despite the decrease in film thickness. This stands in contrast to the film of Comp. Ex. B that was exposed to UV radiation within an air or an oxygen-containing atmosphere. These films are unstable and show absorptions arising from —OH groups present within the film along with an increase in the dielectric constant.

The present invention has been set forth with regard to several preferred embodiments, but the scope of the present invention is considered to be broader than those embodiments and should be ascertained from the claims below.

The invention claimed is:

1. A chemical vapor deposition method for producing a porous film represented by the formula $Si_vO_wC_xH_yF_z$, where v+w+x+y+z=100 atomic %, v is from 10 to 35 atomic %, w is from 10 to 65 atomic %, x is from 5 to 30 atomic %, y is from 10 to 50 atomic %, and z is from 0 to 15 atomic %, the method comprising:

providing a substrate within a vacuum chamber;

introducing into the vacuum chamber gaseous reagents comprising at least one structure-former reagent and at least one pore-former reagent that is distinct from the at least one structure-former reagent, wherein the at least one pore-former reagent is a hydrocarbon having from 1 to 13 carbon atoms;

applying energy to the gaseous reagents in the vacuum chamber to induce reaction of the gaseous reagents to deposit a multiphasic film on the substrate, wherein the multiphasic film comprises at least one structure-forming phase and at least one pore-forming phase, and the preliminary film is deposited without added oxidants; and exposing the multiphasic film to an ultraviolet light source within a non-oxidizing atmosphere for a time sufficient to substantially remove the at least one pore-forming phase contained therein and provide the porous film comprising a plurality of pores and a dielectric constant of 2.7 or less, wherein the at least one structure-former reagent comprises at least one linear organosilane or organosiloxane selected from the group consisting of: diethoxymethylsilane, tetraethoxysilane, dimethyldiethoxysilane, dimethyldimethoxysilane, dimethylethoxysilane, methyldiethoxysilane, triethoxysilane, trimethylphenoxysilane, phenoxysilane, hexamethyldisiloxane, 1,1,2,2-tetramethyldisiloxane, and octamethyltrisiloxane.

2. The method of claim 1, wherein the pore-former reagent is at least one member selected form the group consisting of: alphaterpinene, limonene, cyclohexane, 1,2,4-trimethylcyclohexane, 1,5-dimethyl-1,5-cyclooctadiene, camphene, adamantane, 1,3-butadiene, and decahydronaphthelene.

3. The method of claim 1 further comprising treating the porous film with a second energy source.

4. The method of claim 1 wherein the structure-former reagent comprises dimethylethoxysilane.

5. The method of claim 1 wherein the structure-former reagent comprises dimethyldiethoxysilane.

6. The method of claim 1 wherein the structure-former reagent comprises dimethyldimethoxysilane.

7. The method of claim 1 wherein the structure-former reagent comprises thiethoxysilane.

8. The method of claim 1 wherein the structure-former reagent comprises 1,1,2,2-tetramethyldisiloxane.

9. The method of claim 3 wherein the second energy source comprises photons, α-particles, β- particles, γ-rays, x-rays, electron beam, microwave, radio-frequency wavelengths, plasma, or mixtures thereof.

10. The method of claim 3, wherein the second energy source comprises an ultraviolet light source.

11. The process of claim 10 wherein the ultraviolet light source is comprised of at least one selected from the group consisting of: dispersive, focused, continuous wave, pulsed, shuttered, or mixtures thereof.

12. The method of claim 10 wherein the ultraviolet light source has one or more wavelengths of about 340 nm or below.

13. The process of claim 10 wherein the ultraviolet light source has one or more wavelengths of about 280 nm or below.

14. The process of claim 10 wherein the ultraviolet light source has one or more wavelengths of about 200 nm or below.

15. The process of claim 10 wherein the ultraviolet light source is at least one selected from the group consisting of: an excimer laser, a barrier discharge lamp, a mercury lamp, a microwave-generated UV lamp, a picosecond or sub-picosecond laser, a frequency doubled laser in the IR or visible region, a frequency tripled laser in the IR or visible region, a two-photon absorption from a laser in the visible region, or combinations thereof.

16. The process of claim 1 wherein the exposing step is conducted using a quartz vessel, a deposition chamber, a conveyor belt process system, a hot plate, a vacuum chamber, a cluster tool, a single wafer instrument, a batch processing instrument, a rotating turnstile, or combinations thereof.

17. The process of claim 1 wherein the applying step involves one or more processes selected from the group consisting of: thermal chemical vapor deposition, plasma enhanced chemical vapor deposition, cryogenic chemical vapor deposition, chemical assisted vapor deposition, hot-filament chemical vapor deposition, or combinations thereof.

18. The process for claim 1 wherein the porous film comprises a plurality of pores having an average size of about 100 nanometers or less.

19. The process of claim 18 wherein the porous film comprises a plurality of pores having an average size of about 10 nanometers or less.

20. The process of claim 19 wherein the porous film comprises a plurality of pores having an average size of about 2 nanometers or less.

21. The process of claim 1 wherein the non-oxidizing atmosphere contains at least one gas selected from the group consisting of: nitrogen, carbon dioxide, a reducing gas selected from the group consisting of hydrogen, carbon monoxide, or mixtures thereof, an inert gas, or mixtures thereof.

22. The process of claim 1 wherein the non-oxidizing atmosphere in the exposing step comprises a vacuum.

23. The process of claim 1 wherein the dielectric constant of the porous film after the exposing step is 2.4 or less.

24. The process of claim 23 wherein the dielectric constant of the porous film after the exposing step is 2.2 or less.

25. The process of claim 1 wherein the density of the porous film is at least 25 percent less than the density of the multiphasic film.

26. The process of claim 1 wherein the density of the porous film is at least 50 percent less than the density of the multiphasic film.

27. The method of claim 1 wherein the ultraviolet light source is comprised of at least one selected form the group consisting of: dispersive, focused, continuous wave, pulsed, shuttered, or mixtures thereof.

28. The method of claim 1 wherein the ultraviolet light source has one or more wavelengths of about 340 nm or below.

29. The method of claim 1 wherein the ultraviolet light source has one or more wavelengths of about 280 nm or below.

30. The method of claim 1 wherein the ultraviolet light source has one or more wavelengths of about 200 or below.

31. The method of claim 1 wherein the ultraviolet light source is at least one selected from the group consisting of: an excimer laser, a barrier discharge lamp, a mercury lamp, a microwave-generated UV lamp, a picosecond or sub-picosecond laser, a frequency doubled laser in the IR or visible region, a frequency tripled laser in the IR or visible region, a two-photon absorption from a laser in the visible region, or combinations thereof.

32. The method of claim 1 wherein the structure-former reagent comprises diethoxymethylsilane.

33. The method of claim 32 wherein the pore-former reagent is at least one member form the group consisting of: alpha-terpinene, limonene, cyclohexane, 1,2,4-trimethylcyclohexane, 1,5-dimethyl-1,5-cyclooctadiene, camphene, adamantane, 1,3-butadiene, and decahydronaphthelene.

* * * * *

UNITED STATES PATENT AND TRADEMARK OFFICE
CERTIFICATE OF CORRECTION

PATENT NO. : 7,404,990 B2  Page 1 of 1
APPLICATION NO. : 10/295568
DATED : July 29, 2008
INVENTOR(S) : Aaron Scott Lukas et al.

It is certified that error appears in the above-identified patent and that said Letters Patent is hereby corrected as shown below:

Column 23, Line 3
In claim 1 delete the word "preliminary" and insert the word -- multiphasic --

Column 23, Line 42
In claim 11 delete the word "process" and insert the word -- method --

Column 23, Line 49
In claim 13 delete the word "process" and insert the word -- method --

Column 23, Line 52
In claim 14 delete the word "process" and insert the word -- method --

Column 23, Line 55
In claim 15 delete the word "process" and insert the word -- method --

Column 24, Line 10
In claim 18 delete the word "for" and insert the word -- of --

Column 24, Line 37
In claim 27 delete the word "form" and insert the word -- from --

Column 24, Line 47
In claim 30 insert -- nm -- after 200

Signed and Sealed this

Twenty-eighth Day of October, 2008

JON W. DUDAS
*Director of the United States Patent and Trademark Office*